United States Patent
Park et al.

(10) Patent No.: US 9,337,359 B2
(45) Date of Patent: May 10, 2016

(54) SOLAR CELL AND METHOD FOR MANUFACTURING THE SAME

(75) Inventors: Hyunjung Park, Seoul (KR); Daeyong Lee, Seoul (KR); Youngho Choe, Seoul (KR); Dongho Han, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 538 days.

(21) Appl. No.: 12/817,998

(22) Filed: Jun. 17, 2010

(65) Prior Publication Data

US 2010/0319763 A1    Dec. 23, 2010

(30) Foreign Application Priority Data

Jun. 18, 2009    (KR) .................. 10-2009-0054450

(51) Int. Cl.
H01L 31/068    (2012.01)
H01L 31/0224    (2006.01)
H01L 31/18    (2006.01)

(52) U.S. Cl.
CPC ...... *H01L 31/022425* (2013.01); *H01L 31/068* (2013.01); *H01L 31/1804* (2013.01); *Y02E 10/547* (2013.01); *Y02P 70/521* (2015.11)

(58) Field of Classification Search
CPC . H01L 31/0224; H01L 31/062; H01L 31/068; H01L 31/0682; H01L 31/022425; H01L 31/1804; Y02E 10/547
USPC .......................... 136/255, 261, 252
See application file for complete search history.

(56) References Cited

U.S. PATENT DOCUMENTS

| 4,828,628 A * | 5/1989 | Hezel et al. ............... 136/255 |
| 5,011,782 A * | 4/1991 | Lamb et al. ............... 438/72 |
| 2004/0112426 A1 * | 6/2004 | Hagino ............... 136/261 |
| 2006/0289055 A1 * | 12/2006 | Sridharan et al. ............... 136/252 |
| 2007/0137692 A1 * | 6/2007 | Carlson ............... 136/252 |
| 2007/0215202 A1 * | 9/2007 | Salami et al. ............... 136/256 |
| 2009/0223562 A1 * | 9/2009 | Niira et al. ............... 136/256 |

FOREIGN PATENT DOCUMENTS

| EP | 2 264 786 A1 | 12/2010 |
| KR | 10-2008-0085169 A | 9/2008 |
| WO | WO 2007/126441 A2 | 11/2007 |

OTHER PUBLICATIONS

Hofmann et al., PECVD-ONO: A New Deposited Firing Stable Rear Surface Passivation Layer System for Crystalline Silicon Solar Cells, Mar. 6, 2008, Hindawi Pub Corp, vol. 2008, pp. 1-10.*
Tucci et al., "Laser fired back contact for silicon solar cells", Thin Solid Films, vol. 516, No. 20, Aug. 30, 2008, pp. 6767-6770.

(Continued)

*Primary Examiner* — Marla D McConnell
*Assistant Examiner* — Dujuan Horton
(74) *Attorney, Agent, or Firm* — Birch, Stewart, Kolasch & Birch, LLP

(57) ABSTRACT

A method for manufacturing a solar cell may include forming an emitter region that forms a p-n junction with a semiconductor substrate of a first conductive type, forming a passivation layer on the semiconductor substrate, forming a dopant layer containing impurities of the first conductive type on the passivation layer, and locally forming a back surface field region at the semiconductor substrate by irradiating laser beams onto the semiconductor substrate to diffuse the impurities into the semiconductor substrate.

13 Claims, 10 Drawing Sheets

(56) References Cited

OTHER PUBLICATIONS

Hofmann et al., "Recent developments in rear-surface passivation at Fraunhofer ISE," Solar Energy Materials & Solar Cells, vol. 93, pp. 1074-1078, (Jun. 1, 2009), XP026093572, 2009 (Available online Jan. 25, 2009).

Preu et al., "Laser-Fired Contacts—Transfer of a Simple High Efficiency Process Scheme to Industrial Production," IEEE, Photovoltaic Specialists Conference, pp. 130-133, XP010666424, May 19, 2002.

* cited by examiner

—102

—100

—102

—102

—100

—104
—102

—100

—108

SOLAR CELL AND METHOD FOR MANUFACTURING THE SAME

CROSS-REFERENCE TO RELATED APPLICATION

This application claims priority to and the benefit of Korean Patent Application No. 10-2009-0054450 filed in the Korean Intellectual Property Office on Jun. 18, 2009, the entire contents of which are incorporated herein by reference.

BACKGROUND OF THE INVENTION (a) Field of the Invention

Embodiments of the present invention relate to a solar cell and a method for manufacturing the same.

(b) Description of the Related Art

Recently, as existing energy sources such as petroleum and coal are expected to be depleted, interests in alternative energy sources for replacing the existing energy sources are increasing. Among the alternative energy sources, solar cells generating electric energy from solar energy have been particularly spotlighted. A silicon solar cell generally includes a substrate and an emitter region, each of which is formed of a semiconductor, and a plurality of electrodes respectively formed on the substrate and the emitter region. The semiconductors forming the substrate and the emitter region have different conductive types, such as a p-type and an n-type. A p-n junction is formed at an interface between the substrate and the emitter region.

When light is incident on the solar cell, a plurality of electron-hole pairs are generated in the semiconductors. The electron-hole pairs are separated into electrons and holes by the photovoltaic effect. Thus, the separated electrons move to the n-type semiconductor (e.g., the emitter region) and the separated holes move to the p-type semiconductor (e.g., the substrate), The electrons and holes are respectively collected by the electrode electrically connected to the emitter region and the electrode electrically connected to the substrate. The electrodes are connected to one another using electric wires to thereby obtain electric power.

SUMMARY OF THE INVENTION

According to an aspect of the present invention, a method for manufacturing a solar cell may include forming an emitter region that forms a p-n junction with a semiconductor substrate of a first conductive type, forming a passivation layer on the semiconductor substrate, forming a dopant layer containing impurities of the first conductive type on the passivation layer, and locally forming a back surface field region at the semiconductor substrate by irradiating laser beams onto the semiconductor substrate to diffuse the impurities of the first conductive type into the semiconductor substrate.

According to another aspect, a solar cell may include a semiconductor substrate of a first conductive type, an emitter region containing impurities of a second conductive type opposite to the first conductive type, and being positioned at the semiconductor substrate of a first conductive type, a first electrode connected to the emitter region, a passivation layer positioned on the semiconductor substrate, a dopant layer containing impurities of the first conductive type, and being positioned on the passivation layer, a second electrode positioned on the dopant layer and electrically connected to the semiconductor substrate, and a plurality of back surface field regions positioned at the semiconductor substrate, and connected to the second electrode.

According to another aspect, a solar cell may include a semiconductor substrate of a first conductive type; an emitter region containing impurities of a second conductive type opposite to the first conductive type, and being positioned at the semiconductor substrate of a first conductive type; a first electrode connected to the emitter region; a passivation layer positioned on the semiconductor substrate; a second electrode positioned on the semiconductor layer and electrically connected to the semiconductor substrate; a plurality of back surface field regions locally positioned at the semiconductor substrate, and connected to the second electrode; a plurality of mixed portions locally positioned at the plurality of back surface field regions, the plurality of mixed portions containing at least impurities of the same type as the semiconductor substrate.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
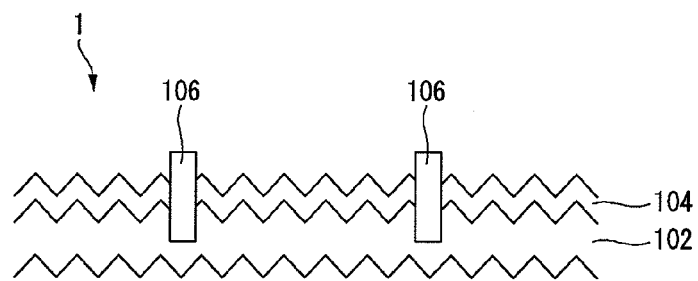
FIG. 1 is a partial cross-sectional view of an example of a solar cell according to an embodiment of the present invention.

The invention will be described more fully hereinafter with reference to the accompanying drawings, in which example embodiments of the inventions are shown. This invention may, however, be embodied in many different forms and should not be construed as limited to only the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the present invention, examples of which are illustrated in the accompanying drawings.

Next, referring to drawings, solar cells according to embodiments of the present invention will be described in detail.

First, solar cells according to an example embodiment of the present invention will be described in reference to FIGS. 1 to 6.

Figure 6:
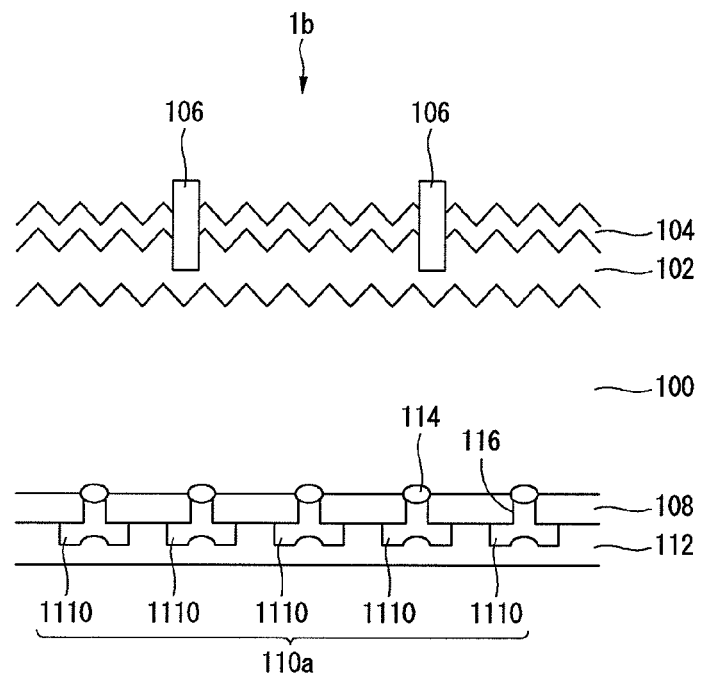

FIG. 1 is a partial cross-sectional view of an example of a solar cell according to an embodiment of the present invention, FIGS. 2A to 2H are sectional views sequentially showing processes for manufacturing the solar cell shown in FIG. 1. FIGS. 3 and 6 are partial cross-sectional views of examples of a solar cell according to an embodiment of the present invention.

First, referring to FIG. 1, one of various examples of a solar cell according to an embodiment of the present invention will be described.

Referring to FIG. 1, a solar cell 1 according to an example of an embodiment includes a substrate 100, an emitter region 102 positioned in (at) a surface (hereinafter, referred to as 'a front surface') of the substrate 100 on which light is incident, an anti-reflection layer 104 on the emitter region 102, a passivation layer 108 positioned on a surface (a rear surface) of the substrate 100, opposite the front surface of the substrate 100, on which the light is not incident, a dopant layer 110 positioned on the passivation layer 108 and partially or selectively connected to the substrate 100 through the passivation layer 108, a plurality of front electrodes (a plurality of first electrodes) 106 connected to the emitter region 102, a rear electrode (a second electrode) 112 positioned on the dopant layer 110 and electrically connected to the substrate 100, and a plurality of back surface field (BSF) regions 114 positioned at (in) locations at which the substrate 100 and the rear electrode are electrically connected to each other. The plurality of BSF regions 114 are positioned locally at the substrate 110.

The substrate 100 is a semiconductor substrate formed of first conductive type silicon, for example, p-type silicon, though not required. Examples of silicon include crystalline silicon such as single crystal silicon and polycrystalline silicon. If the substrate 100 is of the p-type, the substrate 100 may contain impurities of a group III element such as boron (B), gallium (Ga), and indium (In). Alternatively, the substrate 100 maybe of an n-type. If the substrate 100 is of the n-type, the substrate 100 may contain impurities of a group IV element such as phosphorus (P), arsenic (As), and antimony (Sb). In addition, the substrate 100 may be made of other semiconductor materials instead of silicon.

The front surface of the substrate 100 is textured to form a textured surface corresponding to an uneven surface. Hence, a surface area of the substrate 100 increases and a light reflectance of the front surface of the substrate 100 is reduced.

The emitter region 102 positioned in (at) the front surface of the substrate 100 is an impurity region with impurities (e.g., n-type impurities) of a second conductive type opposite the first conductive type of the substrate 100. The emitter region 102 forms a p-n junction with the substrate 100.

By a built-in potential difference generated due to the p-n junction, a plurality of electron-hole pairs, which are generated by incident light onto the semiconductor substrate 100, are separated into electrons and holes, respectively, and the separated electrons move toward the n-type semiconductor and the separated holes move toward the p-type semiconductor. Thus, when the substrate 100 is of the p-type and the emitter region 102 is of the n-type, the separated holes move toward the substrate 100 and the separated electrons move toward the emitter region 102.

Because the emitter region 102 forms the p-n junction with the substrate 100, when the substrate 100 is of the n-type, then the emitter region 102 is of the p-type, in contrast to the embodiment discussed above, and the separated electrons move toward the substrate 100 and the separated holes move toward the emitter region 102.

Returning to the embodiment, when the emitter region 102 is of the n-type, the emitter region 102 may be formed by doping the substrate 100 with impurities of the group V element such as P, As, Sb, etc., while when the emitter region 102 is of the p-type, the emitter region 102 may be formed by doping the substrate 100 with impurities of the group III element such as B, Ga, In, etc.

In reference to FIG. 1, the anti-reflection layer 104 positioned on the emitter region 102 is preferably made of silicon nitride (SiNx) or silicon oxide (SiOx), etc. The anti-reflection layer 104 reduces reflectance of light incident onto the substrate 100, thereby increasing an amount of the incident light on the substrate 100. The anti-reflection layer 104 may also perform a passivation function which converts defects, such as dangling bonds, existing around the surfaces of the substrate 100 into stable bonds to thereby prevent or reduce a recombination and/or a disappearance of charges moving to the surfaces of the substrate 100.

In FIG. 1, the anti-reflection layer 104 has a single-layered structure, but the anti-reflection layer 104 may have a multi-layered structure such as a double-layered structure of SiNx/SiON or SiNx/SiOx or a triple-layered structure of SiOx/SiNx/SiOx. The anti-reflection layer 104 may be omitted, if desired.

The passivation layer 108 positioned on the rear surface of the substrate 100 has a plurality of contact holes 116 for contacting the substrate 100.

The passivation layer 108 may be made of a $SiO_2$, SiNx, or SiOxNy, etc. The passivation layer 108 performs the passivation function near the rear surface of the substrate 100 to prevent or reduce a recombination and/or a disappearance of charges, and thereby a BSRV (back surface recombination velocity) of the electrons and the charges is decreased below about 500 cm/sec to improve an efficiency of the solar cell 1.

The dopant layer 110 positioned on the passivation layer 108 is an impurity portion of the same conductive type, for example, a p-type, as the substrate 100. At this time, the dopant layer 110 contains higher concentration of impurities of the same conductive type than the substrate 100. In the embodiment, the dopant layer 110 may be formed by using boron (B) as the impurities.

The dopant layer 110 is connected to the substrate 100 through the contact holes 116 of the passivation layer 108.

The plurality of the back surface field regions 114 are substantially positioned at (in) the substrate 100 contacting the dopant layer 110 through the contact holes 116 of the passivation layer 108.

The dopant layer 110 also includes a plurality of depressed portions 117. The formation positions of the depressed portions 117 correspond to the formation positions of the back surface field regions 114.

The plurality of back surface field regions 114 are areas heavily doped by impurities of the same conductive type as the substrate 100.

A potential barrier is formed by an impurity concentration difference between the substrate 100 and the back surface field regions 114, thereby distributing the movement of charges (for example, electrons) to a rear portion of the substrate 100. Accordingly, the back surface field regions 114 prevent or reduce the recombination and/or the disappearance of the separated electrons and holes in the rear surface of the substrate 100.

The plurality of back surface field regions 114 maybe formed by irradiating laser beams to drive the impurities contained in the dopant layer 110 into the substrate 100.

Thereby, the shapes of the plurality of back surface field regions 114 are apparent in detail in FIG. 1, but each of the back surface field regions 114 may be a semicircle, a circular cone, a polygonal cone and a pyramid, etc., in the substrate 100.

In the embodiment, the contact holes 116 may be a plurality of openings formed at the passivation layer 108 and exposing portions of the substrate 100.

In this case, portions of the dopant layer 110 are in contact with the substrate 100 exposed through the contact holes (i.e., openings) 116.

Alternatively, the contact holes 116 may be melted portions generated by the laser beams irradiated for forming the back surface field regions 114. That is, when radiating the laser beams, portions on which the laser beams are irradiated are heated and thereby are melted. Thereby, the melted portions in the passivation layer 108 are formed as the contact holes 116, and the impurities contained in the dopant layer 110 are driven into the substrate 100 to thereby form the back surface field regions 114.

In the processes, a mixture of the dopant layer 110 and the passivation layer 108 maybe formed (or filled) at each contact hole 116. Accordingly, since the dopant layer 110 contains impurities of the same type as the semiconductor substrate 100, at each contact hole, there are mixed portions containing at least a material of the passivation layer 108 and impurities of the same type as the semiconductor substrate 100. Material of the rear electrode 112 may also be included, as well as the material of the semiconductor substrate 100.

Additionally, in an embodiment of the present invention, when the laser beans are irradiated to form the contact holes 116 and/or the BSF regions 114 (and at the BSF regions 114), the underlying layers, such as the dopant layer 110, the passivation layer 108, the rear electrode layer 120 and/or portions of the semiconductor substrate 100, are melted as the contact holes 116 and/or the BSF regions 114 are formed, so that the contact holes 116 and/or the BSF regions 114 may be formed in a form of a crater or a crater-like structure, and the materials of the underlying layers may be moved to peripheral edges of the contact holes 116. Thus, the mixture of the underlying layers may be formed at a crater edge position of the contact holes 116. Thus, the BSF regions 114 may be formed at crater edge positions of the contact holes 116, in addition or alternately to the positions shown in FIG. 1, for example.

Additionally, in an embodiment of the present invention, when the laser beans are irradiated to form the contact holes 116 and/or the BSF regions 114, the contact holes 116 may be formed deeply to extend into semiconductor substrate 100. In such an embodiment, various structures, such as the BSF regions 114, for example, may become a buried structure in the semiconductor substrate 100.

The plurality of front electrodes 106 are connected to the emitter region 102 through the anti-reflection layer 104. The plurality of front electrodes 106 are spaced apart from each other and extend in a predetermined direction.

The front electrodes 106 collect charges, for example, electrons, moving toward the emitter region 102.

The front electrodes 106 are preferably made of at least one conductive metal material. Examples of the conductive metal material may be at least one selected from the group consisting of nickel (Ni), copper (Cu), silver (Ag), aluminum (Al), tin (Sn), zinc (Zn), indium (In), titanium (Ti), gold (Au), and a combination thereof. Other conductive metal materials may be used.

The rear electrode 112 is substantially positioned on the entire rear surface of the substrate 100 and is electrically connected to the substrate 100. The rear electrode 112 collects charges, for example, holes, moving toward the substrate 100.

The rear electrode 112 preferably contains Al, but may contain other conductive material. Examples of the conductive material may be at least one selected from the group consisting of Ni, Cu, Ag, Sn, Zn, In, Ti, Au, and a combination thereof. Other conductive metal materials may be used.

In the embodiment of the present invention, since the dopant layer 110 of a p-type semiconductor may contain boron (B), each back surface field region 114 may be back surface field region (B-BSF) containing boron (B) and the mixture may be a mixture (B+Al) of boron (B) and aluminum (Al).

The solar cell 1 may further include at least one bus bar for the front electrodes 106. The bus bar is connected to the emitter region 102 and extends in a direction intersecting the front electrodes 106. The bus bar collects the charges collected by the front electrodes 106 and outputs the collected charges to an external device.

An operation of the solar cell 1 of the structure will be described in detail.

When light irradiated to the solar cell 1 is incident on the substrate 100 of the semiconductor through the anti-reflection layer 104 and the emitter region 102, a plurality of electron-hole pairs are generated in the substrate 100 by light energy based on the incident light.

Further, because both a light incident operation and a light reflection operation are performed on the textured surface, a light absorbance increases, and thereby the efficiency of the solar cell 1 is improved.

In addition, since a reflection loss of light incident onto the substrate 100 is reduced by the anti-reflection layer 104, an amount of the incident light on the substrate 100 increases.

The electron-hole pairs are separated by the p-n junction of the substrate 100 and the emitter region 102, and the separated electrons move toward the emitter region 102 of the n-type and the separated holes move toward the substrate 100 of the p-type. The electrons that move toward the emitter region 102 are collected by the front electrodes 106 in contact with the emitter portions 102, while the holes that move toward the substrate 100 move to the dopant layer 110 through the contact holes 116 and are collected by the rear electrode 112 connected to the dopant layer 110. When the front electrodes 106 and the rear electrode 112 are connected with electric wires, current flows therein to thereby enable use of the current for electric power.

At this time, due to an effect by the passivation function of the passivation layer 108, an amount of charges disappearing near the surface of the substrate 100 is decreased, and due to the plurality of back surface field regions 114, the recombination of the electrons and holes is reduced, to thereby improve the efficiency of the solar cell 1.

Next, referring to FIGS. 2A to 2H, a method for manufacturing the solar cell 1 of the above-structure is described.

FIGS. 2A to 2H are sectional views sequentially showing processes for manufacturing the solar cell shown in FIG. 1.

In a comparative example for manufacturing the solar cell, when forming a plurality of back surface field regions locally and partially dispersed at a rear surface of a crystalline silicon substrate, the back surface field regions were formed through processes removing portions of a passivation layer positioned on the rear surface of the substrate to expose portions of the substrate, diffusing impurities into the exposed substrate through the portions, at which the passivation layer is removed, to form the back surface field regions, and forming a rear electrode electrically connected to the back surface field regions.

Figure 2A:
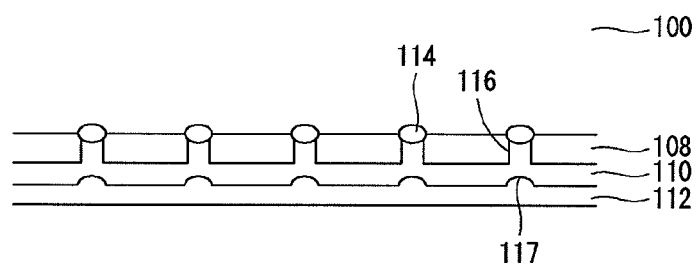
FIGS. 2A to 2H are sectional views sequentially showing processes for manufacturing the solar cell shown in FIG. 1.
Figure 2A:
Figure 3:
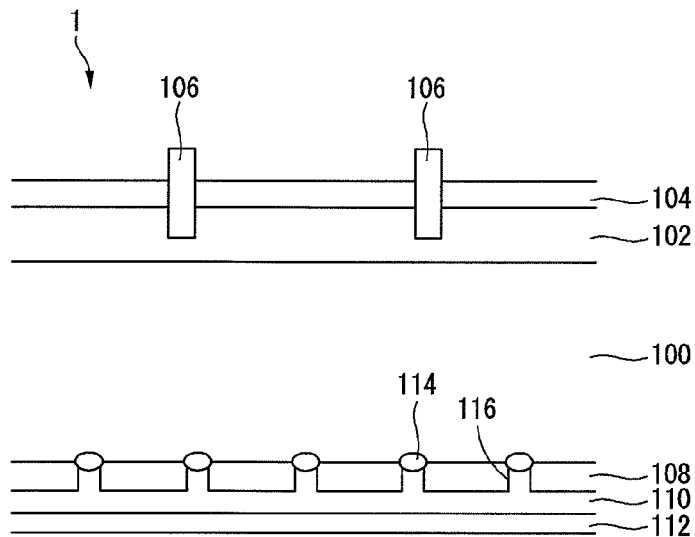
FIGS. 3 to 6 are partial cross-sectional views of examples of a solar cell according to an embodiment of the present invention.

As shown in FIG. 2A, a front surface of a p-type semiconductor substrate 100 doped by impurities of a p-type is textured to form a textured surface which is an uneven surface.

The textured surface may be formed by a wet etching method, a dry etching method such as a RIE (reaction ion etching) method, or a laser beam irradiation process, etc.

In an alternative embodiment, a rear of the substrate 100 may be planarized or textured to increase an amount of light incident onto the substrate 100. At this time, the rear surface of the substrate 100 may be treated by the wet etching method or the dry etching method.

Figure 2B:
Figure 2B:
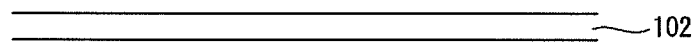

As shown in FIG. 2B, an emitter region 102 is formed by doping impurities of an n-type into the p-type semiconductor substrate 100. At this time, a high temperature thermal process may be performed on the substrate 100 in an environment containing a material (for example, $PH_3$ or $POCl_3$) including an impurity of a group V element such as P, As, and Sb, to diffuse the impurity of the group V element into the substrate 100 and to thereby form an emitter layer 102 on the entire surface of the substrate 100.

Figure 2C:
Figure 2C:

Next, referring to FIG. 2C, a portion of the rear surface of the substrate 100 is removed by the wet etching method, or the dry etching method, etc., to remove the emitter region 102 formed in (at) the rear surface of the substrate 100.

Figure 2D:
Figure 2D:

Next, referring to FIG. 2D, an anti-reflection layer 104 is formed on the emitter region 102 positioned at the front surface of the substrate 100, and a passivation layer 108 is formed on the rear surface of the substrate 100.

At this time, the passivation layer 108 may be formed by a thermal oxide such as silicon oxide ($SiO_2$) generated by a RTO (rapid thermal oxidation) process, which is performed in a furnace for a RTP (rapid thermal process). Further, the passivation layer 108 may be formed by a sputtering method using silicon oxide ($SiO_2$) as a target or may be formed by CVD (chemical vapor deposition) method. The passivation layer 108 may be made of silicon oxide (SiOx), silicon nitride (SiNx), or silicon oxy nitride (SiOxNy).

Figure 2E:
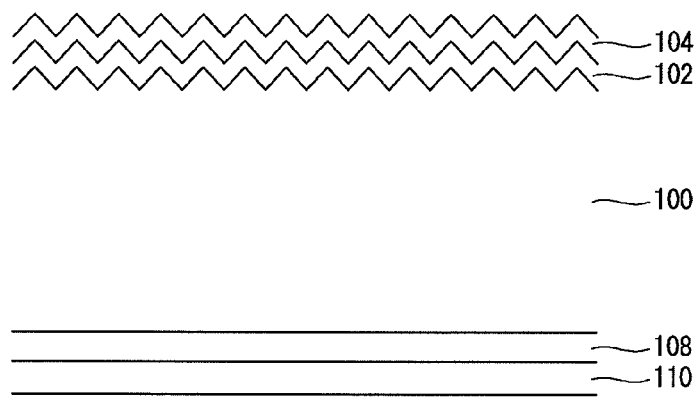

Next, as shown in FIG. 2E, a dopant layer 110 is formed on the passivation layer 108. In this embodiment, since boron (B) is used as impurities for the p-type, the dopant layer 110 is a boron layer containing boron (B). However, the dopant layer 110 may be formed by using other materials.

In the embodiment, the dopant layer 110 may formed by a film formation method such as a direct printing method, a spray-doping method, a spin-on doping method, or a past doping method using a screen printing method and by a thermal process at a low temperature.

Figure 2F:
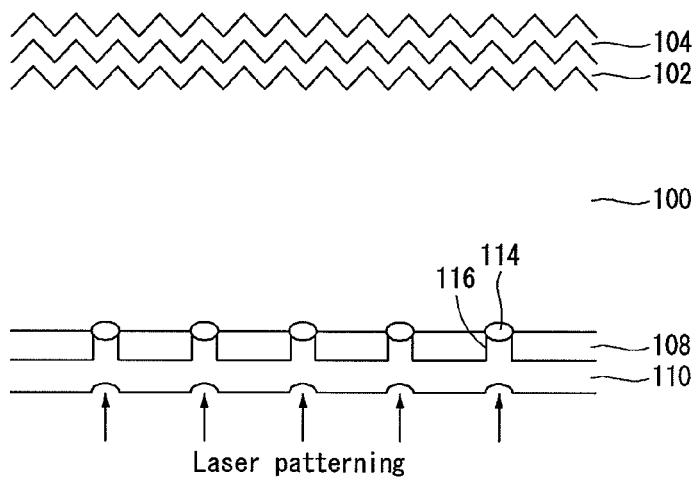

Referring to FIG. 2F, the dopant layer 110 is laser-patterned by laser beams irradiated on portions of the rear surface of the substrate 100 to form a laser pattern at the dopant layer 110. At this time, surface portions (that is, the laser pattern) of the dopant layer 110 on which the laser beams are irradiated, are depressed.

As described above, when the laser beams are irradiated on the portions of the dopant layer 110, the portions of the dopant layer 110 are heated by the laser beams. Thereby, the portions of the dopant layer 110 and the portions of the underlying passivation layer 108 are melted, so that a plurality of contact holes 116 are formed in the passivation layer 108.

That is, materials of the dopant layer 110 and the passivation layer 108 are mixed, and thereby the contact holes 116 at which the portions of the dopant layer 110 are electrically connected to the substrate 100 are formed. At this time, a mixture by the mixing of materials of the dopant layer 110 and the passivation layer 108 may be generated (and/or filled) at the contact holes 116.

In addition, when the laser beams are irradiated, the p-type impurities existing in the dopant layer 110 are driven into the substrate 100 through the contact holes 116. Thereby, a plurality of back surface field regions 114 are formed at portions of the substrate 100 at which are in contact with the contact holes 116. That is, the plurality of back surface field regions 114 is partially or selectively formed at the substrate 100. Each of the back surface field regions 114 has an impurity concentration heavily doped than that of the substrate 100.

However, in an alternative embodiment, when the passivation layer 108 includes a plurality of openings at positions corresponding to the formation positions of the back surface field regions 114, after the formation of the passivation layer 108, the opening are formed at the corresponding positions of the passivation layer 108 by using laser beams, a photolithography, or an etching paste, etc., a dopant layer 110 is formed on the passivation layer and the substrate 100 exposed through the openings, and then, as described in reference with FIG. 2F, by irradiating laser beams on portions of the dopant layer 110 to drive the impurities of the dopant layer 110 into the substrate 100, a plurality of back surface field regions 114 are formed at the substrate 100. At this time, the irradiation positions of the laser beams may be almost consistent with the positions of the openings formed in the passivation layer 108.

The irradiation conditions (the irradiation characteristics) of the laser beams are specially restricted, but it is preferred that the laser beams are irradiated with energy of conditions which not change the characteristics of the substrate 100 within a very short time.

For example, a pulse width of the laser beams may be about 10 femto seconds to about 50 nano seconds. Thereby, when the pulse width of the laser beams is outputted by the femto or nano second basis, the irradiation time of the laser beams is very short and thereby thermal damage of the dopant layer 108 and/or the substrate 100 is prevented or decreased.

For driving impurities of a p-type into the substrate to form the back surface field regions at the solar cell, in an comparative example, after patterning an impurity film on the rear surface of the substrate by using a liquid source containing the impurities such as boron (B), a thermal process was performed in the substrate at a high temperature of about 900° C. to 1050° C., to drive impurities into the substrate. Thereby, due to the high temperature thermal for the impurity diffusion, the substrate was deteriorated or had a deterioration possibility.

However, in case of the embodiment, the dopant layer 110 is formed as one film by using the film formation process performed at a low temperature, and then the impurities of the dopant layer 110 are doped into the corresponding positions of the substrate 100 by partially or selectively irradiating the laser beams, to form the back surface field regions 114. Thus, it is unnecessary to perform the high temperature thermal process for the entire substrate for driving the impurities into the substrate. Accordingly, the deterioration of the substrate 100 due to the high temperature thermal process is prevented or reduced.

Figure 2G:
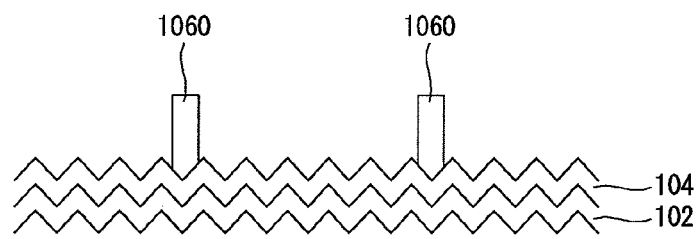
Figure 2G:
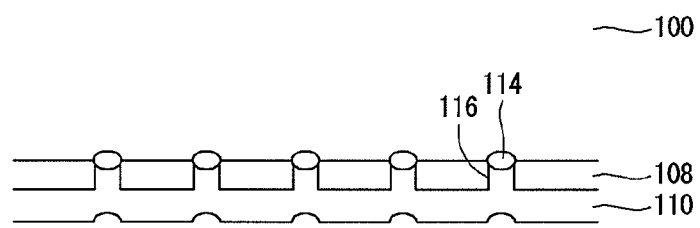
Figure 2H:
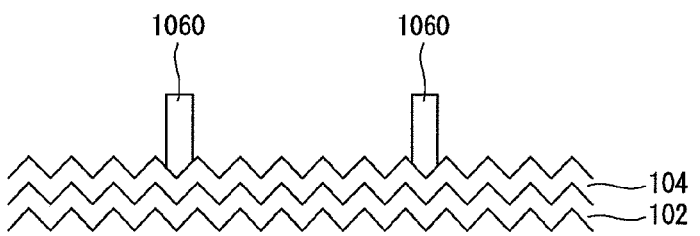
Figure 2H:
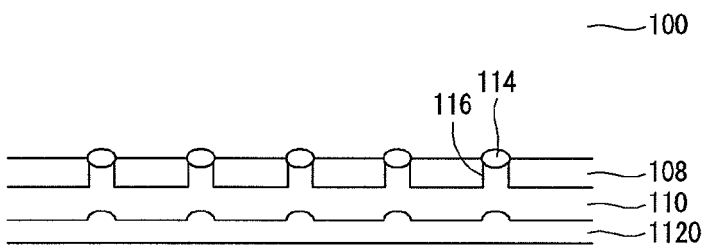

Next, as shown in FIG. 2G, a front electrode paste 1060 is printed (or provided) and dried on the anti-reflection layer 104, and, as shown in FIG. 2H, a rear electrode paste 1120 is printed (or provided) and dried on the dopant layer 110.

The front electrode paste 1060 is an Ag paste including Ag and the rear electrode paste 1120 is an Al paste including Al or an Al-Ag paste including Al and Ag, though not required, but it is not limited to the pastes 1060 and 1120.

The printing order of the front and rear electrode patterns 1060 and 1120 may be changed, and the pastes 1060 and 1120 may be printed by a screen printing method, etc.

Next, a thermal process is performed on the substrate 100 with the front and rear electrode patterns 1060 and 1120 to form a plurality of front electrodes 106 contacting with the emitter region 102 by penetrating the anti-reflection layer 104, a rear electrode 112 partially or selectively contacting with the substrate 100 at the back surface field regions 114. At this time, by the thermal process, the front electrodes 106 and the rear electrode 112 are chemically coupled with other layers contacting therewith, to decrease contact resistances. Thereby, the charge movement between the electrodes 106 and 112 and the emitter region 102 and the substrate 100 is improved.

Next, an edge isolation process is performed to remove the emitter region 102 positioned on sides of the substrate 100. Accordingly, a solar cell 1 is completed shown in FIG. 1.

The performing time of the edge isolation process may be changed.

At this time, in an alternative example, the solar cell 1 shown in FIG. 1 and manufactured by the processes of FIGS. 2a to 2H has the structure shown in FIG. 3.

As shown in FIG. 3, the solar cell 1 does not include a plurality of depressed portions which are depressed toward the substrate 100.

That is, as already described referring to the FIG. 2F, in forming the laser pattern by partially irradiating the laser beams on the dopant layer 110, depressed portions generated by the laser beam irradiation are changed into flat portions since a depressed amount of the dopant layer 110 is small or the depressed portions are planarized during the forming the rear electrode 112 to be flatted. Thereby, a surface of the dopant layer 110 is flatted, to have the flat surface shown in FIG. 3.

Next, referring to FIG. 4, another example of the solar cell according to the embodiment of the present invention will be described.

As compared with FIG. 1, structural elements having the same functions and structures as those illustrated in FIG. 1 are designated by the same reference numerals, and a further description may be briefly made or may be entirely omitted.

Figure 4:
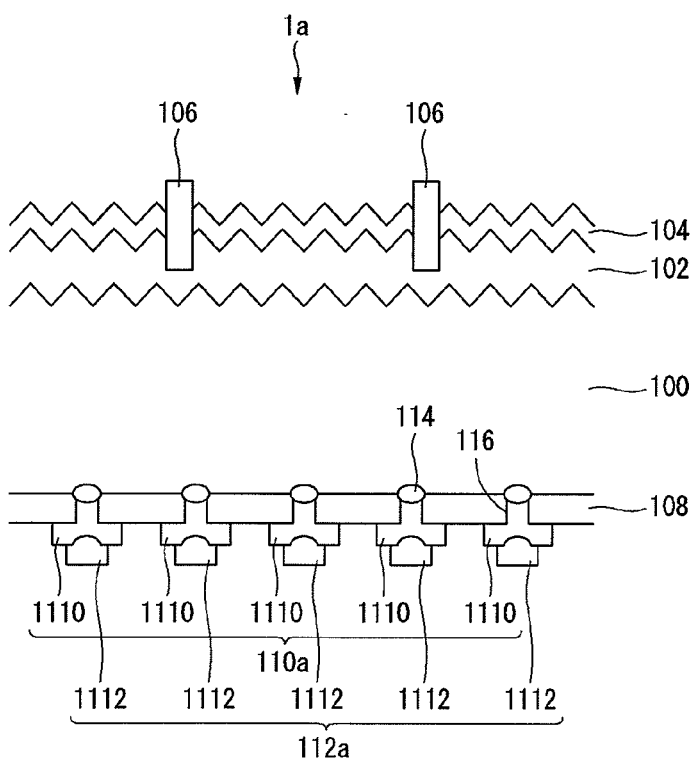
Figure 5:
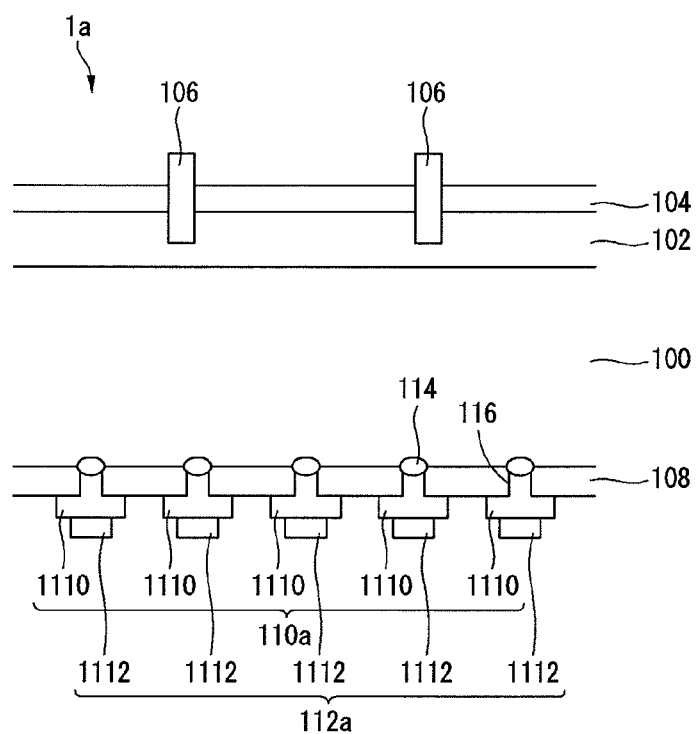

A solar cell 1a shown in FIG. 4 has the similar structure to that of the solar cell 1 of FIG. 1.

That is, the solar cell 1a includes a substrate 100, an emitter region 102 positioned forming a p-n junction with the substrate 100, an anti-reflection layer 104 on the emitter region 102, a plurality of front electrodes 106 connected to the emitter region 102, a passivation layer 108 positioned on a rear surface of the substrate 100, a dopant layer 110a positioned on the passivation layer 108 and connected to the substrate 100 through a plurality of contact holes 116, a rear electrode 112a positioned on the dopant layer 110a, and a plurality of back surface field regions 114 positioned between the substrate 100 and the dopant layer 110a.

However, unlike the solar cell 1 of FIG. 1, in the solar cell 1a, a formation position of the dopant layer 110a on the passivation layer 108 is different from that of the dopant layer 110 of the solar cell 1.

That is, the dopant layer 110a includes a plurality of dopant portions 1110 partially or selectively positioned on the passivation layer 108, instead positioning on the substantially entire passivation layer 108, and spaced away from each other. At this time, the formation position of each the dopant portion 1110 corresponds to that of each back surface field region 114. That is, the plurality of dopant portions 1110 may be locally formed.

As described above, the contact holes 116 for the connection of the substrate 100 and the dopant layer 110a are a plurality of openings formed in the passivation layer 108 or portions made of (or filled with) a mixture mixed with materials of the passivation layer 108 and the dopant layer 110a.

In addition, since the rear electrode 112a is positioned only on the dopant layer 110a, the rear electrode 112a also includes a plurality of rear electrode portions 1112. Each of the rear electrode portions 1112 is positioned only on each dopant portion 1110, not positioned on the substantially entire passivation layer 108. That is, the plurality of rear electrode portions 1112 may be locally formed.

Except that after partially or selectively forming the dopant layer 110a on the passivation layer 108, the rear electrode 112a having the rear electrode portions 1112 is formed only on the dopant layer 110a, a method for manufacturing the solar cell 1a is the same as the method described in reference to FIGS. 2A to 2H. Thereby, the detailed method for manufacturing the solar cell 1a is omitted.

As described in reference to FIG. 3, in case of the solar cell 1a of FIG. 4, when forming the laser pattern by irradiating the laser beams on each of the dopant portions 1110 of the dopant layer 110a, depressed portions generated by the laser beam irradiation are changed into flat portions when a depressed amount of the dopant portions 1110 is small or the depressed portions are planarized during the forming the rear electrode 1112 to be flatted. Thereby, surfaces of the dopant portions 1110 are flatted, to have the flat surface shown in FIG. 5.

As described above, since it is unnecessary to perform the high temperature thermal process for forming the back surface field regions 114, the deterioration of the substrate 100 due to the high temperature thermal process is prevented or reduced. In addition, a formation area of the dopant layer 110a and the rear electrode 112a is reduced, to decrease a manufacturing cost of the solar cell 1a.

Next, referring to FIG. 6, another example of a solar cell according an embodiment of the present invention will be described.

As compared to FIG. 4, except that a rear electrode 112 is positioned on the substantially entire rear surface of the substrate 100, a solar cell 1b shown in FIG. 6 has the same structure as the solar cell 1a of FIG. 4. That is, the rear electrode 112 of the solar cell 1b is positioned on a plurality of dopant portions 1110 and exposed portions of the passivation layer 108. Thereby, since an area of the rear electrode 112 contacting with the dopant portions 1110 increase, a transmission efficiency of the charges is improved.

As described, each of the dopant portions 1110 may have a flat surface instead of a depressed surface even though the laser beams are irradiated on surfaces of the dopant portions 1110.

Except that after partially or selectively forming the dopant layer 110a on the passivation layer 108, the rear electrode 112 is formed on the entire rear surface of the substrate 100, a method for manufacturing the solar cell 1b is the same as the method described in reference to FIGS. 2A to 2H. Thereby, the detailed method for manufacturing the solar cell 1b is omitted.

Next, referring to FIGS. 7 to 10, solar cells according to another embodiment of the present invention will be described.

As compared with FIGS. 1 to 6, structural elements having the same functions and structures as those illustrated in FIGS.

1 to 6 are designated by the same reference numerals, and a further description may be briefly made or may be entirely omitted.

Figure 7:
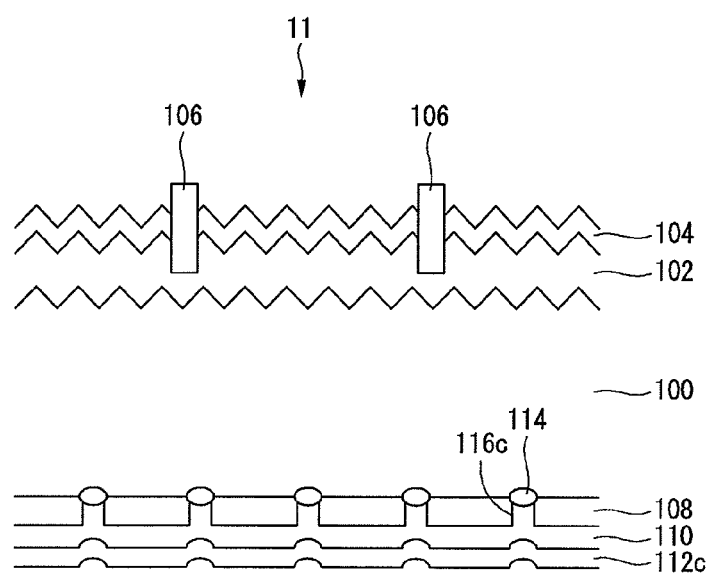
FIG. 7 is a partial cross-sectional views of an example of a solar cell according to another embodiment of the present invention.
Figure 8A:
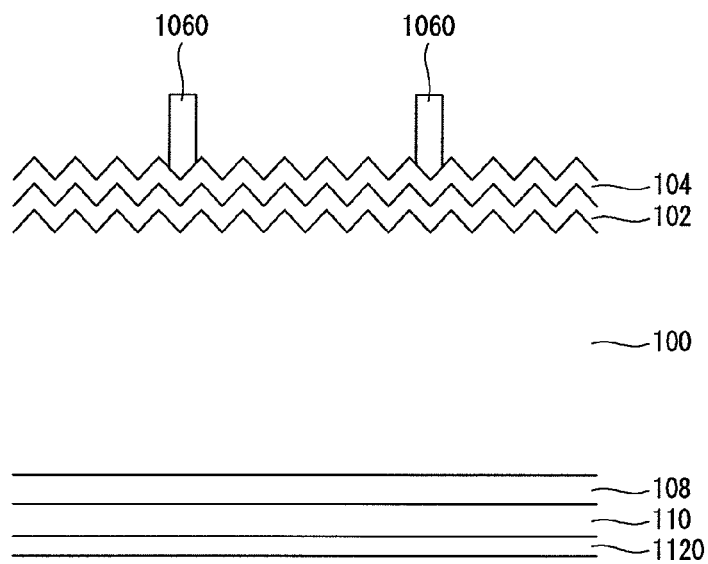
FIGS. 8A and 8B are sectional views showing portions of processes for manufacturing the solar cell shown in FIG. 7.
Figure 8B:
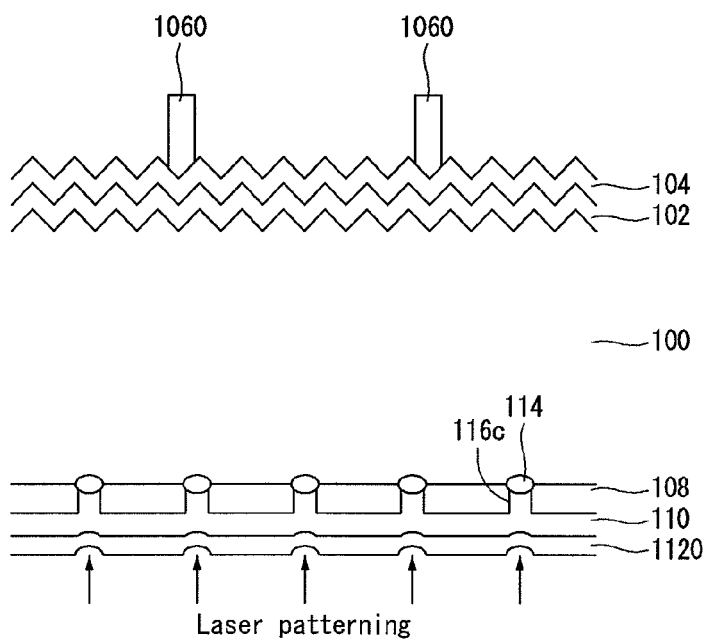
Figure 9:
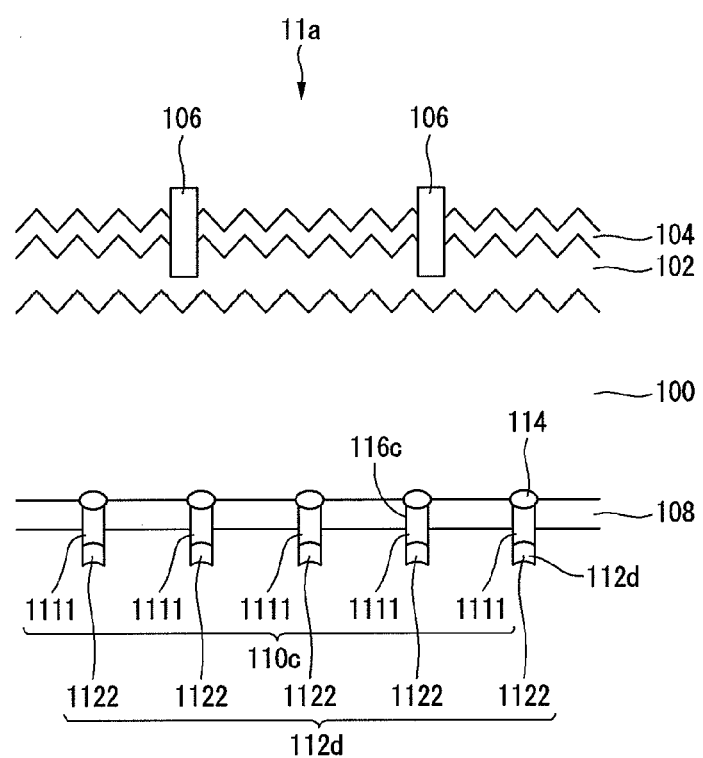
FIGS. 9 and 10 are partial cross-sectional views of other examples of a solar cell according to another embodiment of the present invention.
Figure 10:
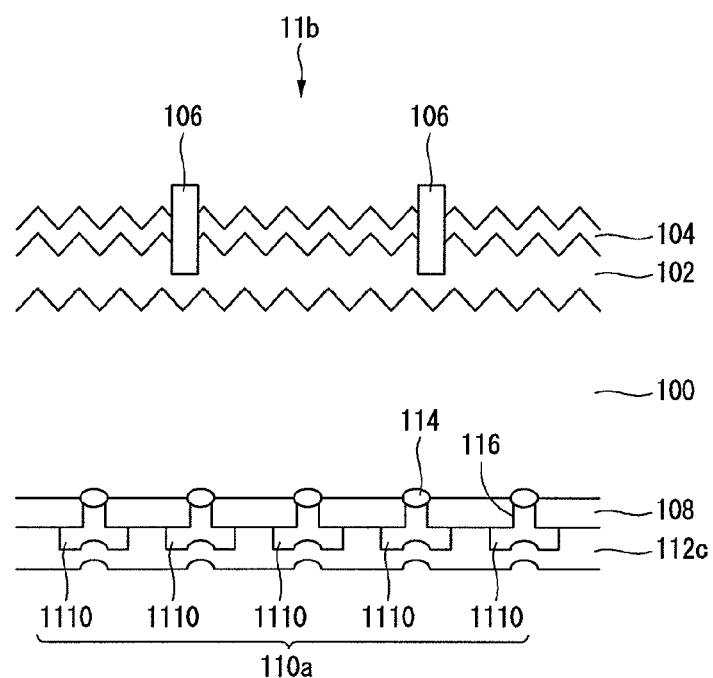

FIG. 7 is a partial cross-sectional view of an example of a solar cell according to another embodiment of the present invention and FIGS. 8A and 8B are sectional views showing portions of processes for manufacturing the solar cell shown in FIG. 7. FIGS. 9 and 10 are partial cross-sectional views of other examples of a solar cell according to another embodiment of the present invention.

Similar to the solar cell 1 of FIG. 1, a solar cell 11 shown in FIG. 7 includes a substrate 100, an emitter region 102 positioned forming a p-n junction with the substrate 100, an anti-reflection layer 104 on the emitter region 102, a plurality of front electrodes 106 connected to the emitter region 102, a passivation layer 108 positioned on a rear surface of the substrate 100, a dopant layer 110 positioned on the entire surface of passivation layer 108 and connected to the substrate 100 through a plurality of contact holes 116c, a rear electrode 112c positioned on the entire surface of the dopant layer 110, and a plurality of back surface field regions 114 positioned between the substrate 100 and the dopant layer 110.

However, in the solar cell 11, the rear electrode 112c and the underlying dopant layer 110 have a plurality of depressed portions, and positions of the depressed portions correspond to portions of the back surface field regions 114. Thereby, a surface of the rear electrodes 112c that faces the outside has flat portions and depressed portions.

At this time, each contact hole 116c may be made of (and/or filled with) a mixture mixed with materials of the dopant layer 110 and the rear electrode 112c or a mixture mixed with materials of the passivation layer 108 as well as the dopant layer 110 and the rear electrode 112c. In the former case, the passivation layer 108 includes a plurality of openings corresponding to formation positions of the back surface field regions 114, while in the latter case, the passivation layer does not include the openings, but the contact holes are formed by the laser beam irradiation, etc.

Thus, the solar cell 11 includes portions positioned in order of the back surface field region 114, the mixture 116c, and the rear electrode 112, and portions positioned in order of the passivation layer 108, the dopant layer 110, and the rear electrode 112 from the rear surface of the substrate 100 to the outside.

Also, the solar cell 11 may further include portions melted and mixed with a dopant of the dopant layer 110 and silicon (Si) of the substrate 100 at interfaces between the substrate 100 and the back surface field regions 114.

A method for manufacturing the solar cell 11 will be described in reference to FIGS. 8A and 8B as well as FIGS. 2A to 2E and 2G to 2H.

FIGS. 8A and 8B are sectional views showing portions of processes for manufacturing the solar cell shown in FIG. 7.

As above described referring to FIGS. 2A to 2E, after texturing of a surface of the substrate 110 to form a textured surface, an emitter region 102 and an anti-reflection layer 104 are sequentially formed on a front surface of the substrate, and a passivation layer 108 and a dopant layer 110 are sequentially formed on a rear surface of the substrate 100.

Next, as described referring to FIGS. 2G and 2H, a front electrode paste 1060 is partially printed and dried on the anti-reflection layer 104 and a rear electrode paste 1120 is printed and dried on the almost entire surface of the dopant layer 110 (FIG. 8A).

As shown in FIG. 8B, a plurality of contact holes 116c and a plurality of back surface field regions 114 are formed by irradiating laser beams on portions of the rear electrode paste 1120. At this time, the contact holes 116c and the back surface field regions 114 are formed at portions at which a laser pattern is formed by the laser beam irradiation. Thereby, the portions of the rear electrode paste 1120 on which the laser beams are irradiated have depressed portions, respectively, and portions of the dopant layer 110 underlying the portions of the rear electrode paste 1120 also have depressed portions, respectively.

However, as already described, when forming the laser pattern by irradiating the laser beams on the portions of the rear electrode paste 1120, the depressed portions generated by the laser beam irradiation may be changed into flat portions when a depressed amount of the dopant layer 110 is small or the depressed portions is planarized during the forming the rear electrode 112 to be flatted. Thereby, unlike FIG. 7, the rear electrode 112c may include the depressed portions, while the dopant layer 110 need not include the depressed portions.

Thus, when the laser beams are irradiated on the portions of the rear electrode paste 1120, heat due to the laser beams is applied to the portions of the rear electrode paste 1120, and then the portions of the dopant layer 110 and the passivation layer 108 which are positioned under the portions of the rear electrode paste 1120 are melted. Thus, materials of the rear electrode paste 1120, the dopant layer 110 and the passivation layer 108 are mixed to form a plurality of contact holes 116c, at which the substrate 100 and the portions of the dopant layer 110 are electrically connected. At this time, each of the contact holes 116c is made of (or filled with) a mixture mixed with the materials of the rear electrode paste 1120, the dopant layer 110, and the passivation layer 108.

In addition, by the laser beam irradiation, impurities of a p-type that are contained in the dopant layer 110 are driven into the substrate 100 through the contact holes 116c. Thereby, the back surface field regions 114 are formed at portions of the plurality of contact holes 116c contacting with the substrate 100. The back surface field regions 114 have a concentration higher than that of the substrate 100.

As described above, irradiation positions of the laser beams correspond to the formation positions of the back surface field regions 114.

The irradiation conditions (the irradiation characteristics) of the laser beams are specially restricted.

In an alternative embodiment, when the passivation layer 108 includes a plurality of openings at positions corresponding to formation positions of the back surface field regions 114, after the formation of the passivation layer 108, the opening are formed at the corresponding positions of the passivation layer 108, a dopant layer 110 and a rear electrode paste 1120 are formed on the passivation and the substrate 100 exposed through the openings of the passivation layer 108, and then by irradiating laser beams on portions of the rear electrode paste 1120 to drive the impurities of the dopant layer 110 into the substrate 100, the plurality of back surface field regions 114 are formed at the substrate 100. At this time, the irradiation positions of the laser beams may be almost consistent with the position of the openings formed in the passivation layer 108. In addition, since the dopant layer 110 is connected to the substrate 100 through the openings, each opening functions as a contact hole and each contact hole (each opening) is mainly filled with a mixture mixed with materials of the rear electrode paste 1120 and the dopant layer 110.

Then, as described, when a thermal process is performed on the substrate 100 with the front electrode paste 1060 and the rear electrode paste 1120, the front electrode paste 1060 penetrates the anti-reflection layer 104 to form a plurality of front electrodes 106 contacting with the emitter region 102 and the rear electrode paste 112b is formed as a rear electrode 112c electrically connected to the substrate 100. Thereby, the solar cell 11 is completed (FIG. 7).

For forming the back surface field regions 114, since, instead of the processes of the pattering the liquid source containing dopants (impurities) of a desired conductive type on the rear surface of the substrate and the diffusing the dopants into the substrate by the high temperate thermal process, the heating for the back surface field regions 114 is partially performed by radiating the laser beams only on desired portions, the deterioration of the substrate 100 due to the thermal process is prevented or reduced.

Referring to FIG. 9, another example of another embodiment of the present invention will be described.

FIG. 9 is a partial cross-sectional view of another example of a solar cell according to another embodiment of the present invention.

As compared to FIG. 7, in a solar cell 11a of FIG. 9, instead of the dopant layer 110 that is positioned on the entire rear surface of the substrate 100, a dopant layer 110c includes a plurality of dopant portions 1111 and the dopant portions 1111 are positioned at positions where a plurality of back surface field regions 114 are positioned. A rear electrode 112d also includes a plurality of rear electrode portions 1122 where the back surface field portions 1122 are positioned, respectively. Thereby, in the example, the number of dopant portions 1111 and rear electrode portions 1122 is plural.

Similar to FIG. 7, in the rear electrode 112d and the dopant layer 110c, surfaces toward the outside include a plurality of depressed portions, respectively, and the dopant layer 110c is in contact with the substrate 100 through the contact holes 116c. As described, each contact hole 116c may be made of (and/or filled with) a mixture mixed with materials of the dopant layer 110c and the rear electrode 112d or a mixture mixed with materials of the passivation layer 108 as well as the dopant layer 110c and the rear electrode 112d.

Except for the above-description, the structure of the solar cell 11a is the same as that of the solar cell 11 of FIG. 4, and thereby the detailed description of the same elements is omitted.

Except that after partially or selectively forming the dopant layer 110c on the passivation layer 108, the rear electrode 112c is formed only on the dopant layer 110c, a method for manufacturing the solar cell 11a is the same as the method described in reference to FIGS. 2A to 2H and FIGS. 8A and 8B. Thereby, the detailed method for manufacturing the solar cell 11a is omitted.

As described, each of the dopant portions 1111 of the dopant layer 110c has a flat surface without the depressed portion.

The solar cell 11a, since it is unnecessary to perform the high temperature thermal process for forming the back surface field regions 114, the deterioration of the substrate 100 is prevented or reduced. In addition, a formation area of the dopant layer 110c and the rear electrode 112c is reduced, to decrease a manufacturing cost of the solar cell 11a.

Next, further another example of the solar cell according to another embodiment of the present invention will be described in reference to FIG. 10.

As compared to FIG. 6, a solar cell 11b of FIG. 10 has the same structure as that of the solar cell 11b, except that a rear electrode 112c includes a plurality of depressed portions.

In difference from FIG. 6, for manufacturing the solar cell 11b, as described referring to FIGS. 8A and 8B, a paste for the rear electrode 112c is printed and dried on a rear surface of a substrate 100, and then laser beams are irradiated on the rear surface of the substrate 100 to form a plurality of contact holes 116c and a plurality of back surface field regions 114. The remaining processes for manufacturing the solar cell 11b are equal to the description described in detail referring to FIG. 6.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A solar cell, comprising:
a semiconductor substrate of a first conductive type;
an emitter region containing impurities of a second conductive type opposite to the first conductive type, and being positioned at the semiconductor substrate of a first conductive type;
a first electrode connected to the emitter region;
a passivation layer positioned on the semiconductor substrate, and having a contact hole;
a back surface field region positioned at the semiconductor substrate, and exposed by the contact hole;
a dopant layer containing impurities of the first conductive type, and being directly positioned on the passivation layer and contacting the back surface field region through the contact hole; and
a second electrode positioned on the dopant layer,
wherein the dopant layer contains the impurities of the first conductive type and is entirely positioned between the passivation layer and the second electrode,
wherein the dopant layer comprises a first surface facing the semiconductor substrate and a second surface opposite the first surface,
wherein the first surface of the dopant layer directly contacts an entire surface of the passivation layer that faces towards the dopant layer, and the entire second surface of the dopant layer directly contacts the second electrode,
wherein a composition of the dopant layer, which contains boron (B), is different from a composition of the second electrode, which contains aluminum (Al),
wherein the contact hole is filled with a mixture comprising a material of the dopant layer and a material of the second electrode,
wherein the mixture is a mixture (B+Al) of boron (B) and aluminum (Al), and
wherein the passivation layer is entirely and directly formed on a back surface of the semiconductor substrate, except for the back surface field region exposed by the contact hole.

2. The solar cell of claim 1, wherein the dopant layer has a surface having a plurality of first depressed portions.

3. The solar cell of claim 2, wherein the plurality of first depressed portions correspond to formation positions of a plurality of back surface field regions, respectively.

4. The solar cell of claim 2, wherein the second electrode has a surface having a plurality of second depressed portions.

5. The solar cell of claim 4, wherein the plurality of second depressed portions correspond to positions of a plurality of back surface field regions, respectively.

6. The solar cell of claim 1, wherein the back surface field region has an impurity concentration of the first conductive type that is higher than an impurity concentration of the first conductive type of the semiconductor substrate.

7. The solar cell of claim 1, wherein the dopant layer has an impurity concentration of the first conductive type that is higher than an impurity concentration of the first conductive type of the semiconductor substrate.

8. The solar cell of claim 1, wherein shapes of the back surface field regions contacting the semiconductor substrate are one of a semicircle, a circular cone, a polygonal cone or a pyramid.

9. The solar cell of claim 1, wherein the dopant layer comprises a plurality of dopant portions that are locally positioned on the passivation layer, and formation positions of the plurality of dopant portions correspond to formation positions of a plurality of back surface field regions.

10. The solar cell of claim 9, wherein the second electrode comprises a plurality of second electrode portions that are locally positioned on the plurality of the dopant portions, respectively.

11. The solar cell of claim 9, wherein the second electrode is positioned on the plurality of dopant portions and portions of the passivation layer on which the plurality of dopant portions are not positioned.

12. The solar cell of claim 1, wherein the dopant layer directly contacts the back surface field region on one side and directly contacts the second electrode on the other side via the first surface and the second surface, respectively.

13. The solar cell of claim 1, wherein the emitter region is entirely and directly formed on a front surface of the semiconductor substrate.

* * * * *